United States Patent [19]

Väisänen

[11] Patent Number: 5,233,634
[45] Date of Patent: Aug. 3, 1993

[54] AUTOMATIC GAIN CONTROL CIRCUIT IN A RADIO TELEPHONE RECEIVER

[75] Inventor: Risto Väisänen, Salo, Finland

[73] Assignee: Nokia Mobile Phones Ltd., Salo, Finland

[21] Appl. No.: 593,093

[22] Filed: Oct. 5, 1990

[30] Foreign Application Priority Data

Oct. 18, 1989 [FI] Finland ................................ 894866

[51] Int. Cl.$^5$ .......................................... H04L 27/08
[52] U.S. Cl. ....................................... 375/98; 375/39; 455/234.1; 330/124 R
[58] Field of Search ................ 375/98, 39; 455/234, 455/241, 245, 251, 245.1, 245.2, 234.1; 330/51, 124 R, 278, 277

[56] References Cited

U.S. PATENT DOCUMENTS

| | | | |
|---|---|---|---|
| 3,636,463 | 1/1972 | Onokiehong | 330/278 |
| 3,699,325 | 10/1972 | Montgomery, Jr. et al. | 235/154 |
| 4,385,400 | 5/1983 | Malchow | 455/234 |
| 4,468,493 | 8/1984 | Johnson et al. | 375/97 |
| 4,476,585 | 10/1984 | Reed | 455/207 |
| 4,574,246 | 3/1986 | Yoshida | 329/124 |
| 4,633,484 | 12/1986 | Takeda et al. | 375/39 |
| 4,774,474 | 9/1988 | Beauducel et al. | 330/129 |
| 4,792,991 | 12/1988 | Eness . | |
| 5,086,437 | 3/1992 | Tomita | 375/98 |

FOREIGN PATENT DOCUMENTS

0099637 2/1984 European Pat. Off. .
2161335 1/1986 United Kingdom .

*Primary Examiner*—Curtis Kuntz
*Assistant Examiner*—T. Ghebretinsae
*Attorney, Agent, or Firm*—Darby & Darby

[57] ABSTRACT

An automatic gain control circuit (AGC) in a receiver for a digital radio telephone. Most of the total gain control of the received signal is accomplished in the base band frequency sections, i.e. in the I and Q branches, where the signal amplification is controlled step by step, and only a minor part of the total gain control is performed in the RF stage. High amplification steps are formed with amplifiers (9a, 10a, 11a, 12a; 9b, 10b, 11b, 12b), wherein the desired amplifier is activated with a digitally controlled (A, B) multiplexer (13a, 13b), and low amplification steps are formed with a resistance attenuator (14a, 14b), in which a signal of desired level is selected by a digitally controlled (C, D, E) multiplexer (15a, 15b). In addition, the RF amplifier (2) has two amplification levels and the desired amplification is selected with a digital control (F). With the different digital control combinations (A, B, C, D, E, F) the entire gain control range required of the receiver can be covered.

14 Claims, 2 Drawing Sheets

AUTOMATIC GAIN CONTROL CIRCUIT IN A RADIO TELEPHONE RECEIVER

BACKGROUND OF THE INVENTION

1. Field of the Invention

The present invention concerns an automatic gain control in a receiver for a digital radio telephone in which the received signal is amplified with an RF amplifier, converted to a first intermediate frequency in a first mixer, potentially converted to a second intermediate frequency in a second mixer, and is thereafter conducted to two branches in which the base band frequency I and Q signals are produced.

2. Discussion of Related Art

In digital radiotelephones, such as in GSM radio telephones, automatic gain control is used to maintain the level of the received signal at a constant value prior to AD converters.

The most common way is to accomplish the AGC function in a way similar to that in AM or SSB receivers wherein the AGC is implemented using a voltage controlled amplifier controlled with analog voltage as the IF amplifier, said amplifier attenuating the signal more the higher its amplitude. In said manner known in the art, part of the AGC function can be placed in the first stages of the receiver.

An example of applying the AM or SSB receiver principles in the GSM radio telephone receiver is presented in FIG. 1. A radio frequency signal from the antenna ANT is filtered and amplified with an amplifier, this being possibly part of the AGC function, and mixed in a mixer 3' with the frequency of a first local oscillator 1.Lo. The produced mixing results are amplified and the signal filtered therefrom is taken to a second mixer 4' in which it is mixed with a second local oscillator frequency. The obtained mixing result is filtered using a filter 5' and is passed through two consecutive amplifier stages, the gain thereof being controlled with a voltage AGC from the D/A converter of the logic section, with the AGC function being thus implemented. After the AGC amplifiers, the signal path is divided into two branches in which the I signals and the Q signals are produced by mixing, in the mixers 6' and 7', the signal frequencies with a third local oscillator frequency, which is directed to the mixers with a 90 degree phase shift relative to one another.

According to the block diagram described above, a receiver can be designed, but a number of deficiencies are associated therewith. The properties of a voltage controlled AGC amplifier located in the intermediate frequency stages are in general poor due to the current controlled amplifiers used and the large control range required in the GSM system. The control curve of the AGC amplifier is non-linear and its shape, as well as the amplification of the amplifier, is dependent on temperature. Owing to said properties, great differences exist between different amplifier exemplars, as a result of which the control curve of the amplifier and the dependence of the properties thereof on temperature must, for each telephone, be tabulated individually or compensated for by means of complex analog circuits.

The amplification of the AGC amplifier should at maximum gain be great in order not to impair the signal/noise ratio when lowering the amplification. Because of the large amplification, it is, on the other hand, necessary to employ good filtering prior to the AGC amplifier because, otherwise, the signals in the adjacent channels will be amplified too much and will cause blockage and an intermodulation phenomenon. A filter presenting good enough characteristics is in general expensive and bulky.

Since in a known circuit the frequency of a local oscillator for use in producing I and Q signals is equal to the intermediate frequency, it is in general exceedingly difficult to prevent the local oscillator signal from becoming connected to the intermediate frequency amplifier. Such connection in itself is not objectionable but in the above circuit in which the amplification of the intermediate amplifier in a second intermediate frequency is changed, major problems arise regarding the d.c. voltage levels in the I branches and Q branches. The d.c. voltage levels in both branches are dependent on the gain of the AGC amplifiers at any one moment, and any change in the gain causes a rapid change in d.c.levels, the effect of which cannot be eliminated such as by means of an a.c. circuit (capacitors) in the I branch and the Q branch.

SUMMARY OF THE INVENTION

An object of the invention is to produce an automatic gain control circuit for the receiver in a radiotelephone with which the drawbacks of the circuit of the prior art described above can be eliminated.

In accordance with the invention, a majority of the total gain control of the received signal is carried out in the base band frequency parts, with the signal gain in the I branch and Q branch being controlled stepwise, and a minor part of the total gain control is accomplished in the RF stage.

As taught by the invention, a majority of the total amplification and the AGC function is placed in the so-called base band frequency sections, that is, in the I and Q branches. The amplifying step desired at each moment is selected using analog multiplexers connecting the selected amplifier step and the selected attenuator stage to the path of the I and Q signals. By controlling the multiplexers, the total of 32 power step combinations is obtained for the I and Q signals.

Moreover, when the RF antenna amplifier is arranged to be so adjustable that its gain can be reduced by means of control such as by 20 dB, the number of amplification steps can, including the above, be increased to be sufficient for the GSM system. The amplifiers in the I and Q branches and the attenuator, as well as possibly the RF amplifier that is adjustable in two steps, if any, constitute and AGC circuit having as its feedback branch a logic circuit monitoring the level of the outgoing I and Q signals and maintaining them substantially constant independent of the strength of the antenna signal. The logic circuit maintains said level constant in that it controls the multiplexers of the I and Q branches so as to (1) select the power step of the amplifiers, and (2) select the attenuation rate of the attenuators located in said branches, using digital control, so that independent of the incoming signal, the outgoing signal is constant.

BRIEF DESCRIPTION OF THE DRAWING

The invention is described below in more detail, reference being made to the accompanying figures, wherein.

DESCRIPTION OF THE PREFERRED EMBODIMENT

Figure 1:
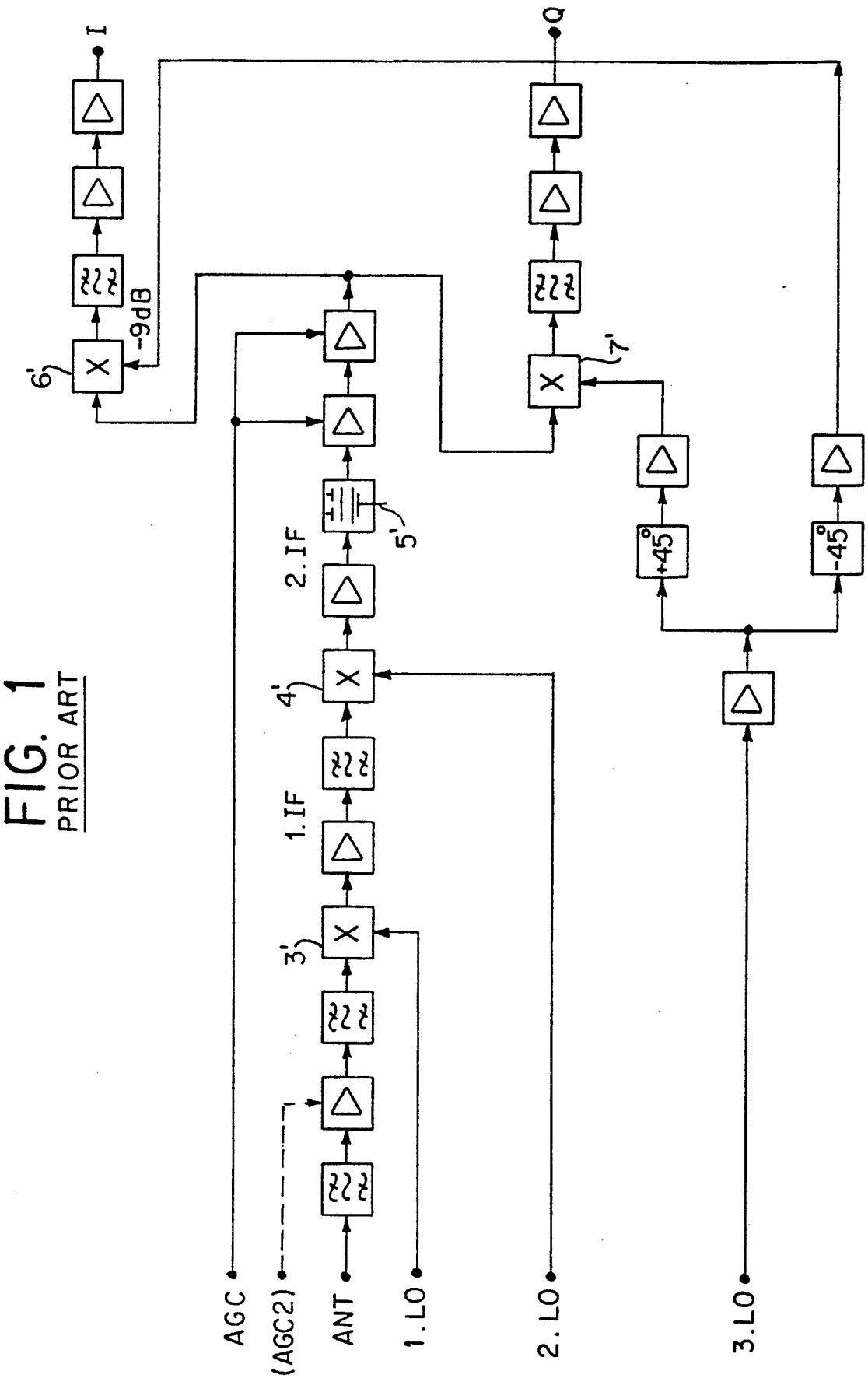
FIG. 1 presents an AGC circuit of a radio telephone receiver according to the prior art.

The circuit of FIG. 1 was already described above as regards its essential aspects in conjunction with the prior art description, and for that reason it will not be described in further detail.

Figure 2:
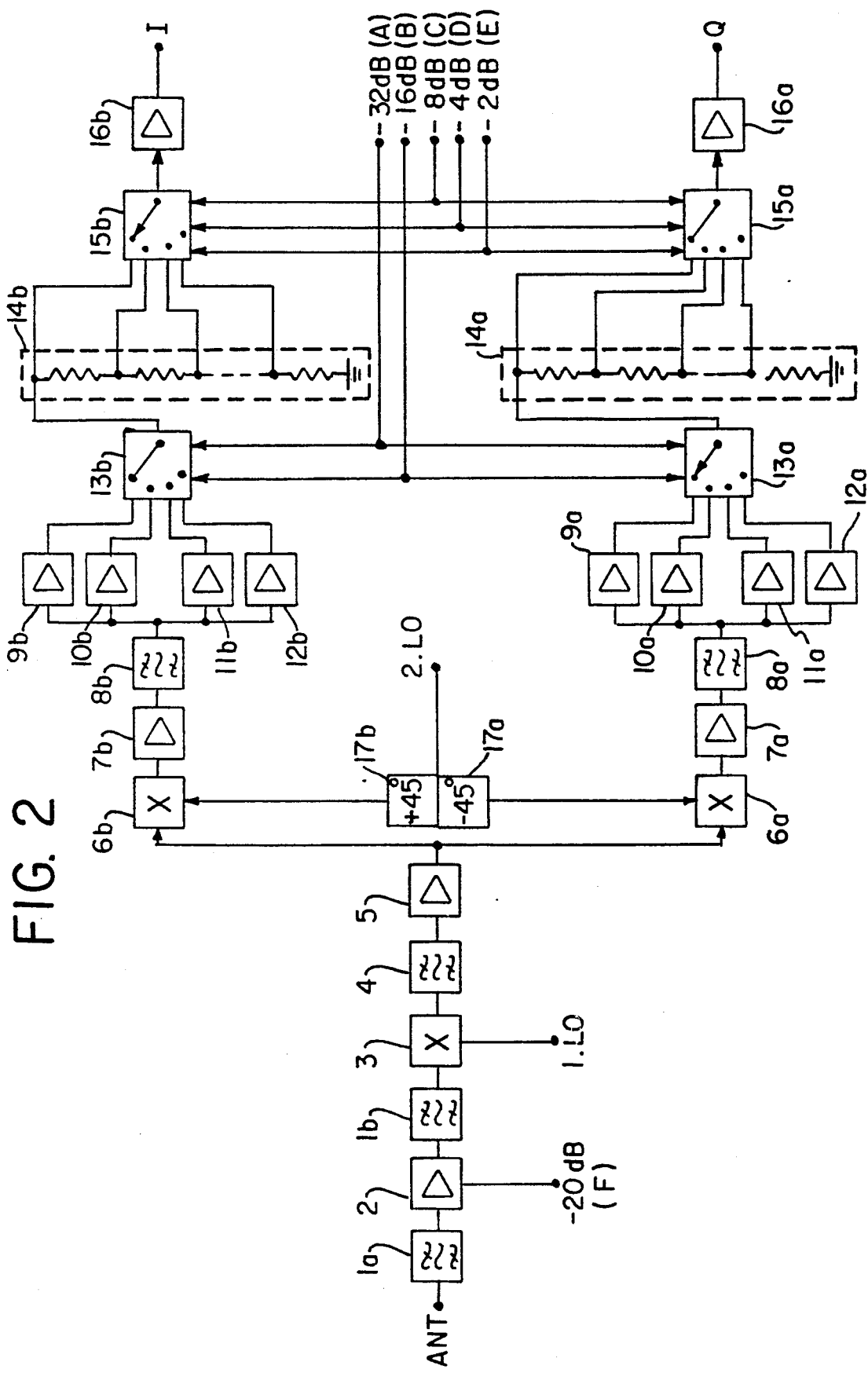
FIG. 2 presents the AGC circuit of a radio telephone receiver of the invention.

As is shown in FIG. 2, a received signal ANT emitted from the antenna is amplified after the filter 1a in an RF amplifier 2, the gain of which can be reduced by control F, e.g. by 20 dB. The signal filtered in the filter 1b is applied to a mixer 3, where it is mixed with a local a local oscillator frequency 1.Lo to produce an intermediate frequency that can be filtered from the mixing results thereof by a filter 4. The output of filter 4 is divided, after being amplified by the intermediate amplifier 5, into two branches for producing I and Q signals.

In said branches, the I/Q signals (of sin and cos shape) are produced in the mixers 6a and 6b by having the incoming signal mixed with the frequency signal 2.Lo from the second local oscillator in the mixers, wherein the incoming local oscillator frequencies are 90 degrees phase shifted with respect to each other. The I/Q signal production is in itself known in the art, and it will not be referred to in the present context. The I and Q signals obtained as mixing results are amplified in amplifiers 7a and 7b, and the high frequencies are filtered from the amplified signals in filters 8a and 8b.

The circuit hereinafter described contains the very core of the invention. The signal path in both branches is divided into a plurality of branches, each of which being provided with an amplifier 91, 10a, 11a, 12a; 9b, 10b, 11b, 12b. In multiplexers 13a, 13b one amplifier may, in both branches at a time, be connected to the signal path, such as by a given multiplexer control for which the signal passes in the I branch through the amplifier 10b and in the Q branch through the amplifier 10a. Said amplifiers have equal gain.

Similarly, with different control of the multiplexers 13a, b the signals will pass through other amplifiers, said amplifiers always having the equal gain, two and two, but it is understood that the amplifiers 9a-12a of the Q branch have different gains, as have also the amplifiers 9b-12b of the I branch. The gain of the amplifiers 10a and 10b could be 50 dB, the gain of the amplifiers 11a and 11b could be 18 dB, and the gain of the amplifiers 12a and 12b could be 2 dB.

The above values are, in fact, gains of said amplifiers. When selecting with a multiplexer a signal of an amplifier branch, a given amplifying step is hereby selected, which means a relative change of the gain. For instance, a signal selected from the 50 dB amplifier corresponds to a 0 dB gain step, that is maximum gain, and a signal from the 2 dB amplifier corresponds to the −48 dB gain step. Selecting 34 dB and 18 dB amplifiers respectively is equivalent to the gain step −16 dB and −32 dB. Different gains may, of course, be used. The multiplexers are controlled using digital control signals A and B, with which the multiplexer can be directed into four different positions. The control signals are obtained from the logic circuit of the telephone which is monitoring the signal level prior to the AD converters.

In the manner described above, great gain steps can be produced. Small gain steps may be produced, as taught by the invention, so that the signal route after the amplifiers is provided with an attenuator in both branches, most preferably a resistance attenuator composed of similar resistance networks 14a and 14b, among which a signal of desired size is selected by multiplexers 15a and 15b. Said multiplexers also receive their control from the control logic of the telephone. With three control signals C, D and E, one out of eight relative gain steps can be selected, and said steps may be, for instance 0 dB, −2 dB, −4 dB, −8 dB, −10 dB, −12 dB, and −14 dB. A given control signal combination C, D and E produces an amplification step of equal magnitude from the attenuators 14a and 14b. After the attenuators 14a and 14b, the signals propagate through the amplifiers 16a and 16b to the output of the circuit. The gain of the amplifiers 16a and 16b could be 15 dB.

By controlling the multiplexers 13a, 13b, and 15a, 15b, altogether 32 different amplification step combinations can be obtained. The range may be further expanded by making the RF amplification 2 so controllable that its gain can be reduced by means of the logic control F, such as in the amount of 20 dB. For instance, an 84 dB power range can be covered with control signals A, B, C, D, E, F at 2 dB intervals. In the GMS system, this is quite sufficient.

In the foregoing, an AGC amplifier circuit placed in the base band frequency parts is introduced. An AGC amplifier circuit paced in the base band frequency sections is in principle implementable in a remarkably simpler way by placing in the base band frequency section in succession logic-controlled amplifier/attenuator stages, the amplifying or attenuating steps thereof would be in 2, 4, 8, 16, 32 dB (and a 20 dB attenuation in the RF part). This has not, however, proved to be possible in practice because the multiplexer or the analog switch causes a brief but strong, e.g. 100 mV, peak-switching voltage in the signal path, which is amplified in the amplifier chain e.g. by 60 dB, and causes a shifting of the DC levels. Another problem is related to a change of the DC levels caused by the offset voltages of the operational amplifiers. The offset voltages is related to the selected gain, if the gain control system selects the gain by changing the feedback in the operational amplifiers with the aid of analog switches.

In the circuit of invention, the effect of the circuit peaks has been eliminated by dividing the signal first into four branches, and by amplifying the level of each branch to correspond the desired amplification step. The level of the signal selected with the multiplexer 13a and 13b is of equal magnitude as in the level of the circuit peak; therefore, the circuit peak causes no harm. The effect of the offset voltages can be eliminated using an AC circuit (capacitors) before the multiplexers. The smallest amplification steps may thereafter be produced by selecting from the resistance attenuator 14a, 14b, a signal of the desired level using the multiplexer 15a, 15b.

With the circuit of the invention, an AGC system of a digital radio telephone receiver is produced with which all amplification steps required in the GSM telephone can be produced without any drawbacks caused by the circuit peaks and changes of DC levels, and without the drawbacks which placing the AGC function in the intermediate frequency stages causes. The amplification steps are precise, and they are not dependent on temperature. Since most of the gain of the AGC function can be placed in the base band frequency parts, the gain of the RF stages and the intermediate frequency stages can be set to be considerably small (e.g. amounting to 20 dB), and consequently, a very simple and inexpensive filter can be used. The entire receiver can be made such that it occupies a very small space because most of the gain and the AGC function are placed in the base band frequency sections, which may be entirely integrated on silicon. The intermediate frequency sections have no gain control associated with the AGC; therefore, connecting a signal from the local oscillator to the intermediate frequency stages is not objectionable. In other words, the DC voltage levels of the I and Q branches do not vary because of the local oscillator signal connected to the intermediate frequency stages.

Maintaining within the protective scope of the claims, the circuit is implementable in practice in a plurality of ways. Thus, for instance, more than four amplifiers may be provided, and the attenuator can be other than the resistance network.

I claim:

1. An automatic gain control circuit in the receiver of a radio comprising:
   RF amplifier means for receiving a radio frequency (RF) signal and amplifying the RF signal with a certain gain;
   first mixer for mixing the amplifier RF signal with a first local oscillator signal to produce a first intermediate frequency signal;
   means for dividing the first intermediate frequency signal between separate I and Q branches;
   further mixer means in each branch for mixing each division of the first intermediate frequency signal with a second local oscillator signal and with a shift of the second local oscillator signal by 90 degrees so as to create respective base band frequency I and Q signals each in a respective one of the I and Q branches;
   base band amplifier means in each of the branches for effecting corresponding control of gain of said I and Q signals, a total gain being a combination of the certain gain of the RF amplifier means and the gain controlled by the base band amplifier means, the base band amplifier means controlling most of the total gain; and
   logic means for detecting an amplitude of the I and Q signals downstream of the base band amplifier means and for controlling with digital control signals at least the base band amplifier means to maintain a selected amplitude level of the I and Q signals, whereby automatic gain control is accomplished.

2. A circuit as in claim 1, wherein said base band amplifier means amplifies in steps and comprises:
   a plurality of branches for the I branch and the Q branch;
   a branch amplifier in each of the respective plurality of branches, the branch amplifiers each having a definite gain; and
   amplifier multiplexer means controlled by said logic means for selecting desired ones of the plurality of branches for the I branch and the Q branch.

3. A circuit as in claim 2, wherein said base band amplifier means for forming low amplifying steps further comprises:
   an attenuator means (14a, 14b) in each of the I branch and the Q branch at a location that is, with respect to a direction of signal propagation, after the branches which contain the respective amplifiers and after the multiplexer (13a, 13b) in a direction of signal propagation, the attenuator being for attenuating the signal being propagated; and
   an attenuator multiplexer means (15a, 15b), which is controlled by means of the digital control signals of said logic means for selecting a desired level of the signal being propagated.

4. A circuit as in claim 3, wherein the attenuator (14a, 14b) is a resistance network.

5. A circuit as in claim 2 or 3, wherein the RF amplifier (2) has two amplifying levels and further comprising means for selecting a desired one of the two amplifying levels by means of the digital control (F) signals of said logic means.

6. A circuit as in claim 5, wherein the radio is a digital radio telephone, different combinations of the digital controls of the multiplexers and of the digital control of the RF amplifier (2) are arranged so that an entire gain control range required of the receiver is covered step by step.

7. A circuit as in claim 1, wherein said further mixer means comprises a second mixer in each of the two branches.

8. A circuit as in claim 1, wherein the I and Q branches are adapted for allowing the I and Q signals to be maintained substantially constant independent of the strength of the received RF signal.

9. A circuit as in claim 1, further comprising attenuators located in the two branches; and attenuation multiplexers for selecting an attenuation rate of the attenuators to enable an outgoing signal to be independent of the strength of the received RF signal.

10. A circuit as in claim 1, wherein said base band amplifier means comprises a plurality of amplifiers of different gain in each branch.

11. A circuit as in claim 10, wherein one of the amplifiers in each of the branches have the same gain of each other.

12. A circuit as in claim 8, wherein the attenuators produce signals which propagate through the amplifiers of the same branch so as to have an amplification step of equal magnitude.

13. A circuit as in claim 1, further comprising means for effecting the amplification in steps which are independent of temperature.

14. A circuit as in claim 1, wherein the I and Q branches have direct current voltage levels which do not vary.

* * * * *